United States Patent
Horioka et al.

(10) Patent No.: US 9,593,432 B2
(45) Date of Patent: Mar. 14, 2017

(54) COATED SILICA CRUCIBLE HAVING A BUBBLE-FREE LAYER, AND METHOD OF PRODUCING THE SAME

(75) Inventors: Yukichi Horioka, Chiba (JP); Shiro Sakuragi, Ibaraki (JP)

(73) Assignee: FTB RESEARCH INSTITUTE CO., LTD, Chiba (JP)

(*) Notice: Subject to any disclaimer, the term of this patent is extended or adjusted under 35 U.S.C. 154(b) by 594 days.

(21) Appl. No.: 14/114,002

(22) PCT Filed: Dec. 2, 2011

(86) PCT No.: PCT/JP2011/077934
§ 371 (c)(1),
(2), (4) Date: Jan. 16, 2014

(87) PCT Pub. No.: WO2012/147231
PCT Pub. Date: Nov. 1, 2012

(65) Prior Publication Data
US 2014/0150714 A1 Jun. 5, 2014

(30) Foreign Application Priority Data
Apr. 28, 2011 (JP) .................................. 2011-100295

(51) Int. Cl.
*C30B 15/10* (2006.01)
*C30B 29/06* (2006.01)
*C03C 17/34* (2006.01)

(52) U.S. Cl.
CPC .......... *C30B 15/10* (2013.01); *C03C 17/3417* (2013.01); *C30B 29/06* (2013.01); *Y10T 117/1032* (2015.01)

(58) Field of Classification Search
CPC .......... C30B 15/00; C30B 15/10; C30B 15/20; C30B 35/00; C30B 35/002; Y10T 117/00;
(Continued)

(56) References Cited

U.S. PATENT DOCUMENTS 5,976,247 A * 11/1999 Hansen .................. C03C 17/02
117/200
5,980,629 A 11/1999 Hansen et al.
(Continued)

FOREIGN PATENT DOCUMENTS

CN 201762478 U 3/2011
JP 9-110579 4/1997
(Continued)

OTHER PUBLICATIONS

Second China Office action, dated Jan. 22, 2015, with an English translation thereof.for CN 2011800004906.5.
(Continued)

*Primary Examiner* — Kenneth A Bratland, Jr.
(74) *Attorney, Agent, or Firm* — Greenblum & Bernstein, P.L.C.

(57) ABSTRACT

A coating method for coating a crucible and a quartz crucible for growing a silicon crystal are provided. In the coating method, a bubble-free quartz layer which is 80 μm to 4 mm thick is formed on an inner surface of a crucible for growing a silicon crystal, and the surface of the bubble-free quartz layer is covered with alkaline earth hydroxide, following which heating is performed to a temperature at which the surface becomes devitrified. The surface may be covered by immersing the inner surface in a solution of the alkaline earth hydroxide. The heating may be performed before the crucible for growing silicon crystal is filled with a solid raw material to be melted.

2 Claims, 5 Drawing Sheets

(58) Field of Classification Search
CPC ......... Y10T 117/1024; Y10T 117/1032; F27B 14/00; F27B 14/08; F27B 14/10; F27B 14/104
USPC .................. 117/11, 13, 200, 206, 208, 900
See application file for complete search history.

(56) References Cited

U.S. PATENT DOCUMENTS

| | | | |
|---|---|---|---|
| 2002/0166340 A1* | 11/2002 | Kemmochi | C30B 15/10 65/17.3 |
| 2003/0012898 A1 | 1/2003 | Kemmochi et al. | |
| 2003/0012899 A1 | 1/2003 | Kemmochi et al. | |
| 2003/0106491 A1 | 6/2003 | Kemmochi et al. | |
| 2007/0051296 A1 | 3/2007 | Kemmochi et al. | |
| 2007/0084397 A1 | 4/2007 | Hansen et al. | |

FOREIGN PATENT DOCUMENTS

| | | |
|---|---|---|
| JP | 2008-81398 | 4/2008 |
| JP | 2009-512619 | 3/2009 |
| TW | 592945 B | 6/2004 |
| TW | 238204 B | 8/2005 |

OTHER PUBLICATIONS

Japan Office action, dated Aug. 16, 2011, with an English translation thereof.for JP 2011-100295.
Korea Office action, dated Apr. 19, 2013, with an English translation thereof.for KR 10-2011-0071656.
China Office Action, dated May 6, 2014 along with an English translation thereof.for CN201180004906.5.
PCT International Preliminary Report on Patentability dated Nov. 7, 2013, No English translation.for PCT/JP2011/077934.

* cited by examiner

COATED SILICA CRUCIBLE HAVING A BUBBLE-FREE LAYER, AND METHOD OF PRODUCING THE SAME

BACKGROUND OF THE INVENTION

1. Field of the Invention

The present invention relates to a method of forming a coating on a quartz crucible for growing silicon crystal, the crucible comprising a devitrified layer, to prevent silicon oxide being mixed into raw material melt contained in the crucible in the manufacture of silicon crystals.

2. Description of the Related Art

In the Czochralski method for growing a single crystal, a crucible used to contain the raw material melt has a coating formed on the inner surface thereof to reduce mixing of impurities from the crucible to the raw material melt. The coating largely affects on the quality and yield of the single crystal and has been variously studied.

For example, JPH09-110579A discloses a method used in the Czochralski method for growing a single crystal, in which devitrification accelerator is attached to the inner surface of a crucible for containing the semiconductor material to be melted at a temperature of about 600° C. or less, and then the crucible is heated to a temperature above 600° C. to form a substantially devitrified silica layer on the inner surface. The devitrification accelerator includes those including alkali earth metal selected from the group consisting of calcium, barium, magnesium, strontium, and beryllium. By this method, while the Czochralski method is carried out, in particular, the polysilicon is melt, a stable seed crystal nucleus is formed in a nucleus formation region provided by the devitrification accelerator, glassy silica is crystallized on the crucible surface, and a substantially homogeneous and continuous devitrified shell of β-cristobalite is formed on the crucible surface. The substantially homogeneous and continuous devitrified shell (which corresponds to the devitrified coating in the present invention) formed on the inner surface of the crucible homogeneously dissolves when in contact with the molten raw material (silicon melt). The discharge of the β-cristobalite particles into the melt can thus be reduced, thereby minimizing the dislocation formed in the grown crystal. It is also advantageous that the devitrified shell formed on the crucible outer surface can strengthen the crucible.

Patent Literature 1: JPH09-110579A

SUMMARY OF THE INVENTION

Although the above method uses barium hydroxide as the devitrification accelerator and has been actually widely used, it has difficulty to form a uniform devitrified shell (devitrified coating) on the entire inner surface of the crucible, and actually forms a shell having some pin holes. Note, however, that pin holes having a small diameter do not pose a significant problem in the manufacture of crystals because the raw material melt usually cannot flow in such pin holes due to its viscosity. Also, even if the pin holes have a sufficient diameter to allow the raw material melt to flow therein, small contact area between the raw material melt and quartz of the crucible will extremely reduce mixing of impurities into the raw material melt, which still do not pose a significant problem in the manufacture of crystals.

Unfortunately, in repeated use of the crucible, which has recently been attempted for resource saving, cost reduction or the like, a problem arises in which when the pin holes are sufficiently large to allow the molten raw material to flow therein, the quartz layer exposed in the pin holes are eroded by the molten raw material that flows therein, and damaged by the molten raw material that is solidified, deposited, and expanded, and the erosion and damage are enlarged as the use is repeated. There is also a problem that progress of the damage of the quartz layer finally results in destruction of the crucible inner surface.

In view thereof, it is an object of the present invention to provide a method of coating a quartz crucible for growing a silicon crystal that may reduce the diameter of pin holes formed in a devitrified coating.

A method of coating according to the present invention includes the steps of: forming a bubble-free quartz layer having a thickness of 80 μm to 4 mm inclusive on an inner surface of a quartz crucible for growing a silicon crystal, covering the surface of the bubble-free quartz layer with alkaline earth hydroxide, and heating the surface to at least a temperature at which the surface becomes devitrified.

The surface may be covered by immersing the inner surface in a solution including the alkaline earth hydroxide. The heating may be performed before the crucible for growing a silicon crystal is filled with a solid raw material to be melted.

A quartz crucible for growing a silicon crystal according to the present invention includes a bubble-free quartz layer having a thickness of 80 μm to 4 mm, and a devitrified coating formed by covering a surface of the bubble-free quartz layer with alkaline earth hydroxide and then heating the surface to at least a temperature at which the surface becomes devitrified.

By the method of coating according to the present invention, the devitrified coating is formed on a quartz layer that includes no bubbles and has a very smooth surface, thus making it possible to reduce the diameter of pin holes formed during the generation of the devitrification. Note that although the quartz crucible is usually made of opacified quartz to provide necessary strength, the inventors have found out that pin holes having a large diameter are formed in the devitrified coating due to two factors: the bubbles included in the opacified quartz; and the variation of the application thickness of the devitrification accelerator caused by the surface roughness of the opacified quartz layer. The present invention is based on this new knowledge. The bubble-free quartz layer having a thickness of at least 80 μm may form the devitrified coating, but the layer having too much thickness will provide a crucible of insufficient strength. Therefore, the bubble-free quartz layer needs to have a thickness of 4 mm or less.

A quartz crucible for growing a silicon crystal according to the present invention is a crucible that has a devitrified coating formed by the method of coating according to the present invention. The quartz crucible according to the present invention includes pin holes of very small diameter, and then repeated use of the crucible will not damage the quartz layer.

DESCRIPTION OF THE PREFERRED EMBODIMENTS

Figure 3:
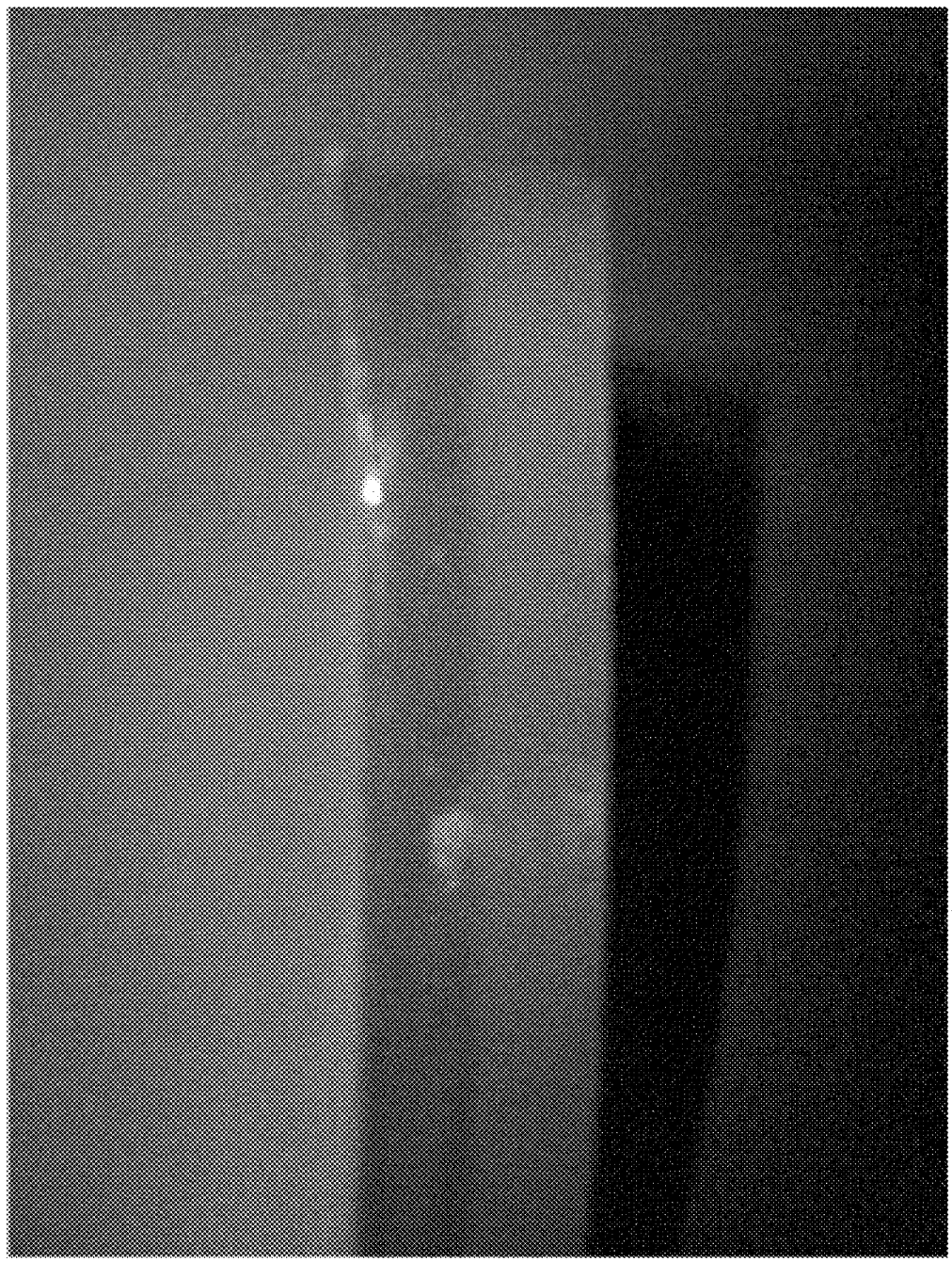
FIG. 3 is a drawing-substituting photograph showing a fracture surface of a bubble-free quartz layer having a devitrified coating formed thereon.
Figure 4:
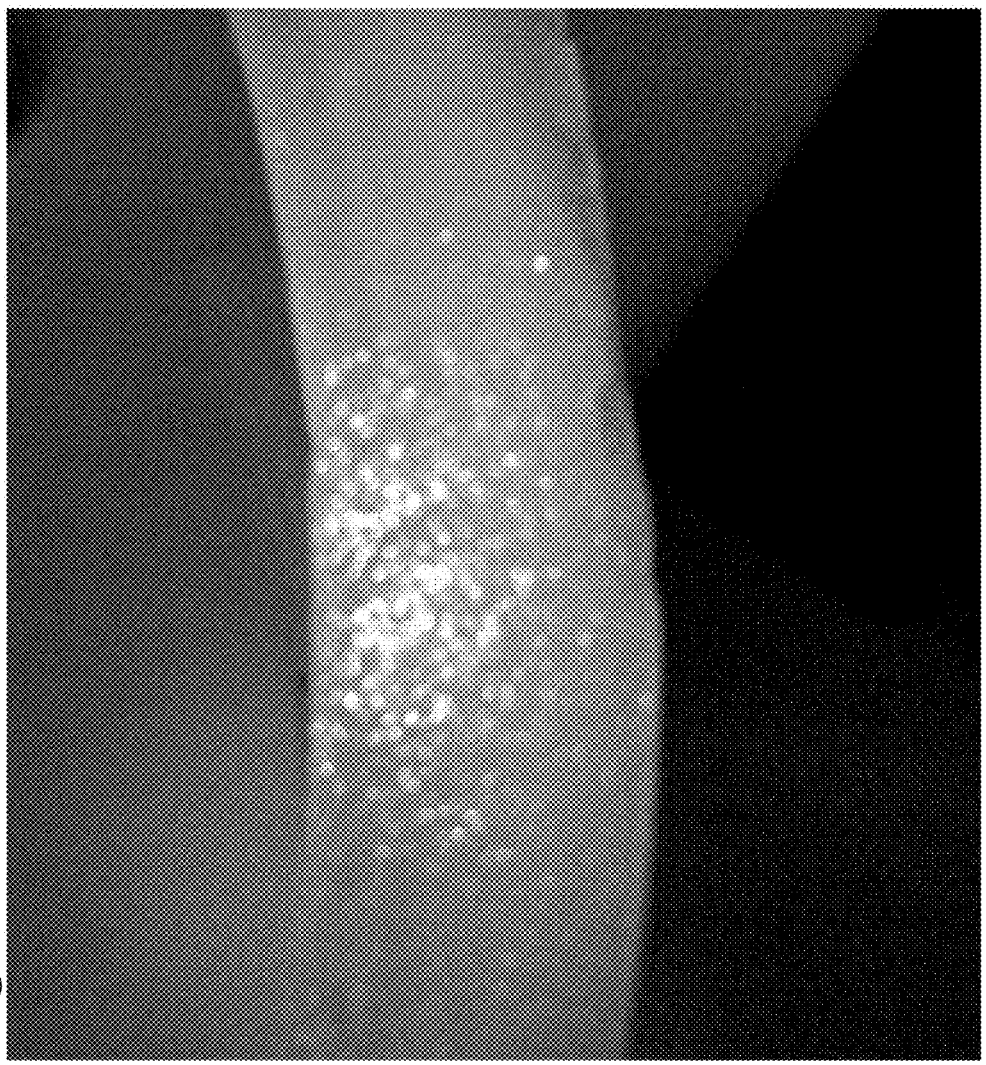
FIG. 4 is a drawing-substituting photograph showing a fracture surface of a opacified quartz layer having a devitrified coating formed thereon.

As an example, a bubble-free quartz layer of 4 mm thickness was applied with barium hydroxide to form a devitrified coating on the bubble-free quartz layer in the manufacture of a single crystal. Then, the surface of the devitrified coating after the single crystal was manufactured was visually checked and photographed. Meanwhile, as a comparative example, for a well-known quartz crucible including only opacified quartz and no bubble-free quartz layer, the surface of the devitrified coating after the single crystal was manufactured was also visually checked and photographed. Note that the surfaces were photographed with a digital high scope system DH-2400DP (the product name, available by HIROX Co., Ltd.). The objective lens was set at magnification of 100. Using the same setting condition, the test specimens of the example and the comparative example were each photographed. In addition, as a reference, FIGS. 3 and 4 are digital camera photographs of fracture surfaces of the quartz layers having formed thereon the devitrified coatings of the example and the comparative example.

Figure 1:
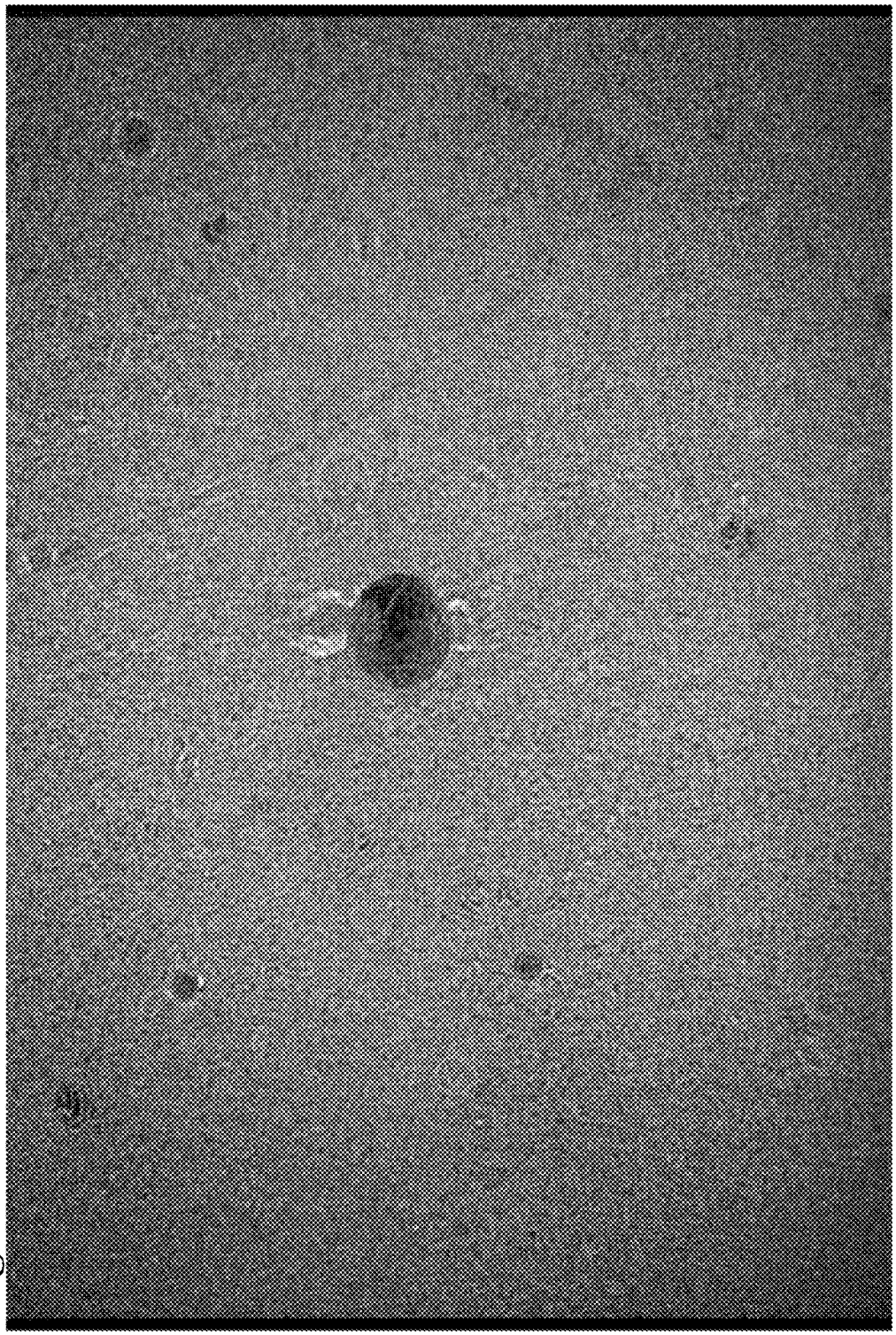
FIG. 1 is a drawing-substituting photograph showing a post-use surface condition of a devitrified coating formed on a bubble-free quartz layer.
Figure 2A:
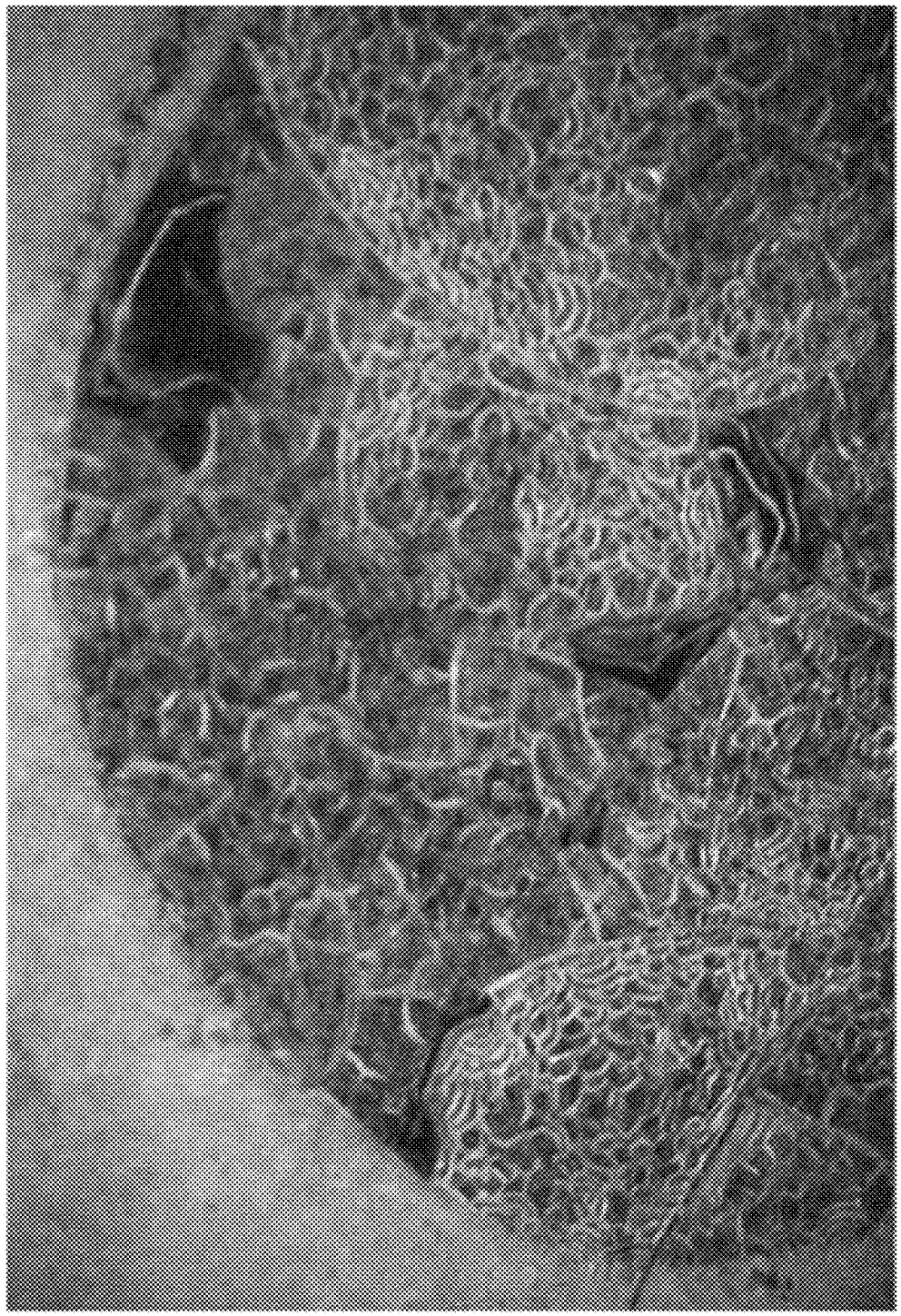
FIG. 2A is a drawing-substituting photograph showing a post-use surface condition of a devitrified coating formed on a opacified quartz layer.
Figure 2B:
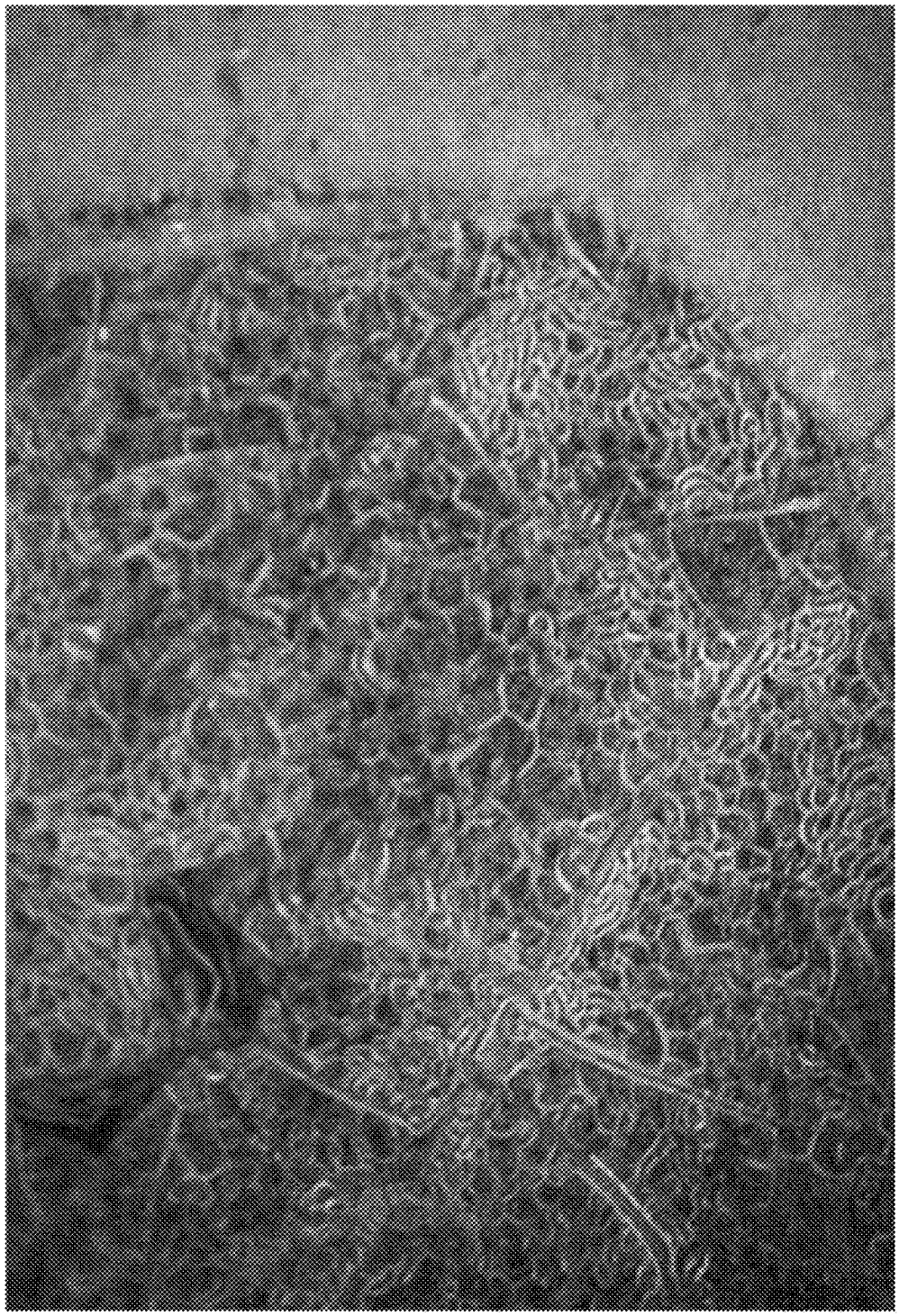
FIG. 2B is a drawing-substituting photograph showing a post-use surface condition of a devitrified coating formed on a opacified quartz layer.

The visual check showed that very large pin holes were not confirmed in the devitrified coating of the example, but formation of very large pin holes were confirmed in the devitrified coating of the comparative example. FIG. 1 shows relatively large pin holes visually confirmed in the example. FIGS. 2A and 2B show pin holes photographed in the same condition in the comparative example. The pin holes in the example have a small diameter and a very small exposed area of the quartz layer, thus providing a low possibility of damage caused by flow-in of the molten raw material. In contrast, the pin holes shown in FIGS. 2A and 2B are very large and provide a high possibility of flow-in of the molten raw material. In addition, the bottoms of the pin holes have portions where the quartz layer is largely exposed, thus providing a high possibility of damage caused by the molten raw material that flows in the pinholes. Note that because the pin holes shown in FIGS. 2A and 2B are larger than the pin holes shown in FIG. 1 and could not be fully photographed in the same magnification, approximately two-thirds of the whole pin holes were photographed in two separate pictures. In addition, in FIG. 3, the upper layer is the bubble-free quartz layer.

What is claimed is:

1. A method of coating, comprising the steps performed in the following order:
    covering the surface of a bubble-free quartz layer having a thickness of 80 μm to 4 mm inclusive on an inner surface of a quartz crucible for growing a silicon crystal, with alkaline earth hydroxide; and
    heating the surface to at least a temperature at which the surface becomes devitrified before filling the crucible for growing a silicon crystal with a solid raw material to be melted.

2. The method of coating according to claim 1, wherein covering the surface of the bubble-free quartz layer with alkaline earth hydroxide is performed by immersing the inner surface in a solution including the alkaline earth hydroxide.

\* \* \* \* \*